(12) United States Patent
Wang et al.

(10) Patent No.: US 8,030,153 B2
(45) Date of Patent: Oct. 4, 2011

(54) HIGH VOLTAGE TMOS SEMICONDUCTOR DEVICE WITH LOW GATE CHARGE STRUCTURE AND METHOD OF MAKING

(75) Inventors: Peilin Wang, Beijing (CN); Edouard D. de Frésart, Tempe, AZ (US); Ganming Qin, Chandler, AZ (US); Hongwei Zhou, Beijing (CN)

(73) Assignee: Freescale Semiconductor, Inc., Austin, TX (US)

( * ) Notice: Subject to any disclaimer, the term of this patent is extended or adjusted under 35 U.S.C. 154(b) by 459 days.

(21) Appl. No.: 11/932,070

(22) Filed: Oct. 31, 2007

(65) Prior Publication Data

US 2009/0108339 A1    Apr. 30, 2009

(51) Int. Cl.
*H01L 21/8238* (2006.01)
(52) U.S. Cl. ............... 438/212; 257/329; 257/E29.198
(58) Field of Classification Search ............ 257/268, 257/288, 328, 329, 339, 341, 409, E29.256, 257/E29.198; 438/192, 206, 209, 212, 217, 438/268, 272, 303, 305
See application file for complete search history.

(56) References Cited

U.S. PATENT DOCUMENTS

| | | | |
|---|---|---|---|
| 4,300,138 A | 11/1981 | Nakauchi et al. | |
| 4,376,286 A | 3/1983 | Lidow et al. | |
| 4,803,533 A | 2/1989 | Chang et al. | |
| 5,273,922 A | 12/1993 | Tsoi | |
| 5,703,389 A | 12/1997 | Knoch et al. | |
| 5,789,994 A | 8/1998 | Case et al. | |
| 6,046,473 A | 4/2000 | Blanchard | |
| 6,072,216 A | 6/2000 | Williams et al. | |
| 6,639,276 B2 | 10/2003 | Spring et al. | |
| 6,791,143 B2 | 9/2004 | Baliga | |
| 6,828,605 B2 * | 12/2004 | Eisele et al. | 257/213 |
| 7,491,595 B2 * | 2/2009 | Huang et al. | 438/199 |
| 2003/0008014 A1 | 1/2003 | Shelness | |

FOREIGN PATENT DOCUMENTS

EP    0119400 B1    5/1987
WO   2007070050 A1   6/2007

OTHER PUBLICATIONS

Chen, Wanjun et al.; "A Novel VDMOSFET Structure with Reduced Gate Charge"; 2005; pp. 1395-1398; IEEE.
PCT/US2005/045432 International Search Report and Written Opinion mailed Oct. 10, 2006.
Koyabashi, T. et al; "High-Voltage Power MOSFET's Reached Almost to the Silicon Limit"; Proceedings of 2001 International Symposium on Power Semiconductor Devices & ICs; 2001; pp. 435-438; Osaka, Japan.

* cited by examiner

*Primary Examiner* — David Vu
(74) *Attorney, Agent, or Firm* — Michael J. Balconi-Lamica

(57) ABSTRACT

A TMOS device (10) is formed using a semiconductor layer (16) of a first type. First and second regions (62,64) of the second type are formed in the semiconductor layer and are spaced apart. A third region (68) is formed in the semiconductor layer by implanting. The third region is between and contacts the first and second doped regions, is of the second conductivity type, and is less heavily doped than the first and second doped regions. A gate stack (67) is formed over a portion of the first doped region, a portion of the second doped region, and the third doped region. By implanting after forming the gate stack, fourth and fifth regions (98,100) of the first type are formed in interior portions of the first and second doped regions, respectively. The third region being of the same conductivity type as the first and second regions reduces Miller capacitance.

14 Claims, 8 Drawing Sheets

HIGH VOLTAGE TMOS SEMICONDUCTOR DEVICE WITH LOW GATE CHARGE STRUCTURE AND METHOD OF MAKING

BACKGROUND

1. Field

This disclosure relates generally to field effect transistor (FET) devices, and more specifically, to high voltage TMOS FET devices with a low gate charge structure and a method of making the same.

2. Related Art

Field effect transistors (FETS) are widely used today. A common variety are often referred to as metal-oxide-semiconductor (MOS) devices even though the "metal" may be made of other things than simple metals and the "oxide" may also be of other things than simple oxides. Accordingly, as used herein the terms "metal" and "oxide" are intended to include any convenient and stable conductive and insulating materials, respectively. A particular variety of MOS devices useful for power applications are TMOS devices, so called because the current pathway follows a "T" shape.

While conventional TMOS devices are very useful, they suffer from a number of limitations well known in the art. For example, the on-resistance $R_{DS(ON)}$ is often higher than desired, the gate-source and gate-drain capacitances $C_{GS}$ and $C_{GD}$ are often larger than desired, the gate charge $Q_G$ can be larger than desired, and other device properties may also be less than optimum. While various improvements have been made in the past to attempt to ameliorate these problems, it has often been the case that what is done to improve one characteristic results in degradation of another important characteristic. For example, the device on resistance $R_{DS(ON)}$ can be improved by increasing a doping level within a JFET region or by increasing a length dimension of the gate; however, this tends to undesirably increase the Miller capacitance $C_{GD}$ and/or the gate charge $Q_G$, and/or undesirably reduce the break-down voltage $BV_{DSS}$ of the device. Conversely, $C_{GD}$ and $Q_G$ can be reduced, and/or $BV_{DSS}$ can be increased by thickening the gate oxide above the JFET region or decreasing the gate length; however, this tends to increase the device on resistance $R_{DS(ON)}$ and/or undesirably perturb the threshold voltage of the device. These and other factors combine to limit the device's ability to switch large amounts of power at high frequencies.

A figure of merit (FOM)=$R_{DSON}*Q_G$ can be defined at a predetermined threshold voltage that is useful in predicting the capabilities of TMOS power devices for high frequency, high power applications. Present day TMOS power devices have FOM values in the range of about 90 to 120 (milli-Ohms)*(nano-Coulombs) at, for example, a gate to source voltage of $V_{GS}$=4.5 volts. In order to be able to efficiently switch significant amounts of power (e.g., 20-200 amps) at frequencies in the range of about 10E5 to 10E6 cycles per second (cps) or higher, smaller values of FOM are important. Thus, there is an ongoing need for TMOS devices whose figure of merit is more suited to high-frequency, high-power applications. Accordingly, there is a need for TMOS devices having these and other desirable features. Furthermore, it is desirable to provide an improved device structure and method that provide TMOS devices of the desired properties, especially devices with figures of merit equal or less than about 80 (milli-Ohms)*(nano-Coulombs). In addition, it is desirable that changes in device structure and method of fabrication used to improve the devices be compatible with existing device manufacturing techniques.

Additional desirable features and characteristics of the embodiments of the present disclosure will become apparent from the subsequent detailed description and the appended claims, taken in conjunction with the accompanying drawings and the foregoing technical field and background.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
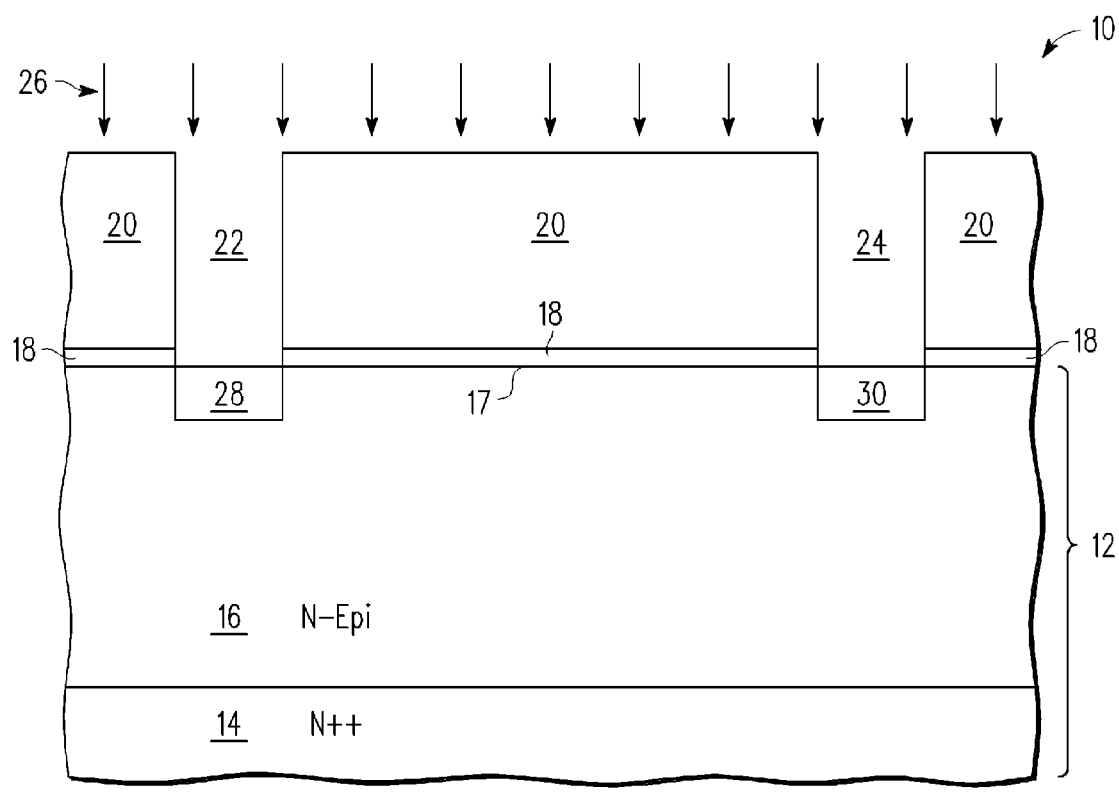
FIGS. 1-14 illustrate simplified schematic cross-sectional views of a high voltage TMOS device with a low gate charge structure at various stages of manufacture according to one embodiment of the present disclosure.

The following detailed description is merely exemplary in nature and is not intended to limit the embodiments of the present disclosure or the application and uses of the embodiments of the present disclosure. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the embodiments of the present disclosure. Additionally, elements in the drawings figures are not necessarily drawn to scale. For example, the dimensions of some of the elements or regions in the figures may be exaggerated relative to other elements or regions to help improve understanding of embodiments of the present disclosure.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

MOS devices may be P-channel type devices referred to as PMOS devices or N-channel type devices, referred to as NMOS devices. The embodiments of the present disclosure relate usefully to NMOS devices and are described herein for such structures. However, this is for convenience of illustration and not intended to be limiting and the principles taught herein also apply to PMOS devices. Thus, as used herein the terms "P-type" and "N-type" are intended to be equivalent to and include the more general terms "first conductivity type" and "second conductivity type" respectively, where "first" and "second" can refer to either P or N conductivity types. As discussed herein, the terms "metal" and "oxide" and metal-oxide semiconductor and the abbreviation "MOS" are intended to include any reasonably stable conductive and insulating materials, respectively, such as those described herein, but not limited thereto.

Structures according to the embodiments of the present disclosure simultaneously decrease the Gate-to-Drain capacitance and augment the breakdown voltage BVdss of planar Vertical DMOS transistors with very minor increase of the Rdson, for example, on the order of a few percent. Such a combination advantageously enables the achieving of extremely low Rdson*Qg and high BVdss using standard and robust planar technology. Other structures such as trenchFET with thick bottom oxide are much more difficult to process with high yield.

According to one embodiment, the MOS device includes a P-layer that has been introduced underneath the accumulation region to shield the gate electrode from direct exposure to the drain electrode. This provides several benefits. On benefit includes decreasing the Gate-Drain capacitance Cgd, to minimize the factor of merit (FOM), wherein FOM=Rdson*Qg. FOM is critical for fast switching applications. Another benefit is improving the breakdown voltage (BVdss) by making the depletion layer more like a planar P-N junction in the reverse mode. Yet another benefit is reducing the Idss leakage in the reverse mode by reducing the electrical field under the gate electrode. According to one embodiment, a doping profile of a planar discrete power MOSFET is advantageously modified, as discussed herein, in order to reduce the Qgd component of the gate charge.

As mentioned above, FIGS. 1-14 illustrate simplified schematic cross-sectional views of a high voltage TMOS device with a low gate charge structure at various stages of manufacture according to one embodiment of the present disclosure. Turning now to FIG. 1, a cross-sectional view of a high voltage TMOS device 10 is shown during one stage in the manufacture thereof. In particular, there is provided a semiconductor wafer 12 having an N++ doped layer or substrate 14 on which has been grown or otherwise formed an N-type layer or region 16. In one embodiment, substrate 14 comprises a silicon substrate. Layer or region 16 can comprise, for example, an epi-layer; however, this is not essential, and the identification of layer 16 on FIGS. 1-16 as an "N-Epi" layer is merely by way of example and not intended to be limiting. The combination of the highly doped layer or region 14 surmounted by region 16 of substantially uniform doping may be achieved in other ways well known in the art. In addition, the semiconductor substrate described herein can be any semiconductor material or combinations of materials, such as gallium arsenide, silicon germanium, silicon-on-insulator (SOI), silicon, monocrystalline silicon, the like, and combinations of the above.

In one embodiment, layer or substrate 14 is arsenic doped to about 0.004 Ohm-cm; however, larger or smaller doping levels may also be used. In addition, layer 16 is phosphorous doped to approximately 0.1 to 3 Ohm-cm, and more particularly, approximately 0.55 Ohm-cm; however, higher and lower doping can also be used. Layer 16 is preferably about 3-10 micro-meters in thickness; however, thinner or thicker layers can also be used. Initial oxide layer 18 of a few thousand Angstrom units thickness is provided on upper surface 17. Mask layer 20 of, for example, a suitable photoresist is applied on initial oxide layer 18 and patterned to provide openings 22 and 24 extending to semiconductor surface 17. Ion implantation 26 introduces P-type doped regions 28 and 30 into the N-type layer 16 through openings 22 and 24, respectively, thus providing the structure illustrated in FIG. 1. Ion implantation 26 can comprise, for example, utilizing boron as a doping method; however, other doping arrangements well known in the art can also be used for providing the doped regions 28 and 30.

Figure 2:
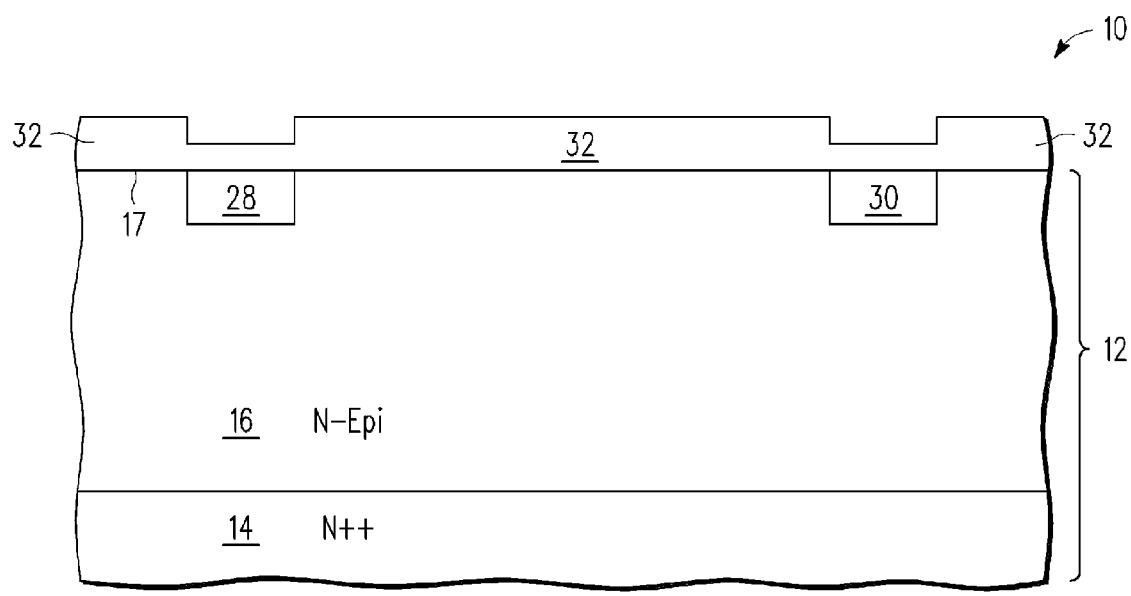
Figure 3:
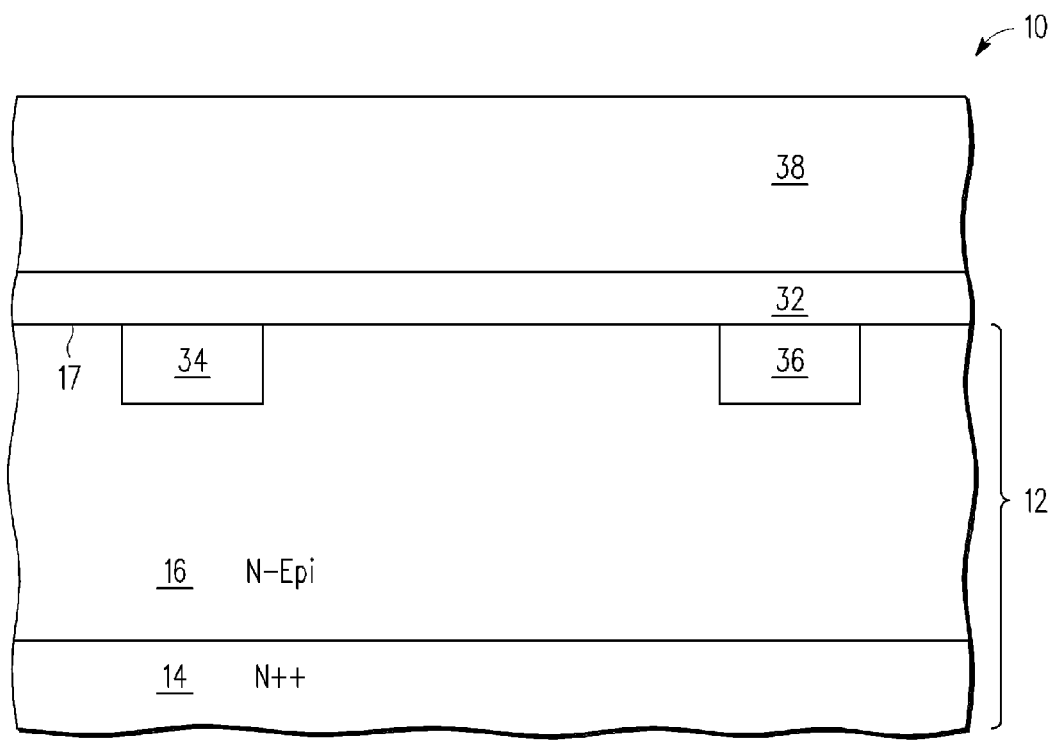
Figure 4:
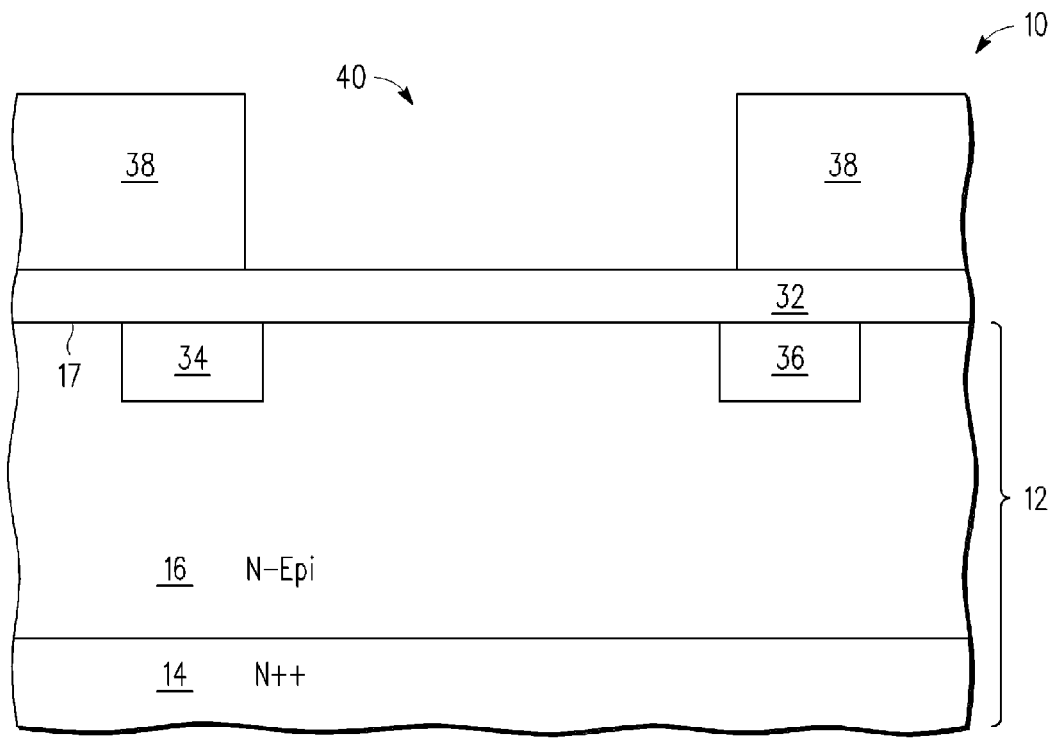
Figure 5:
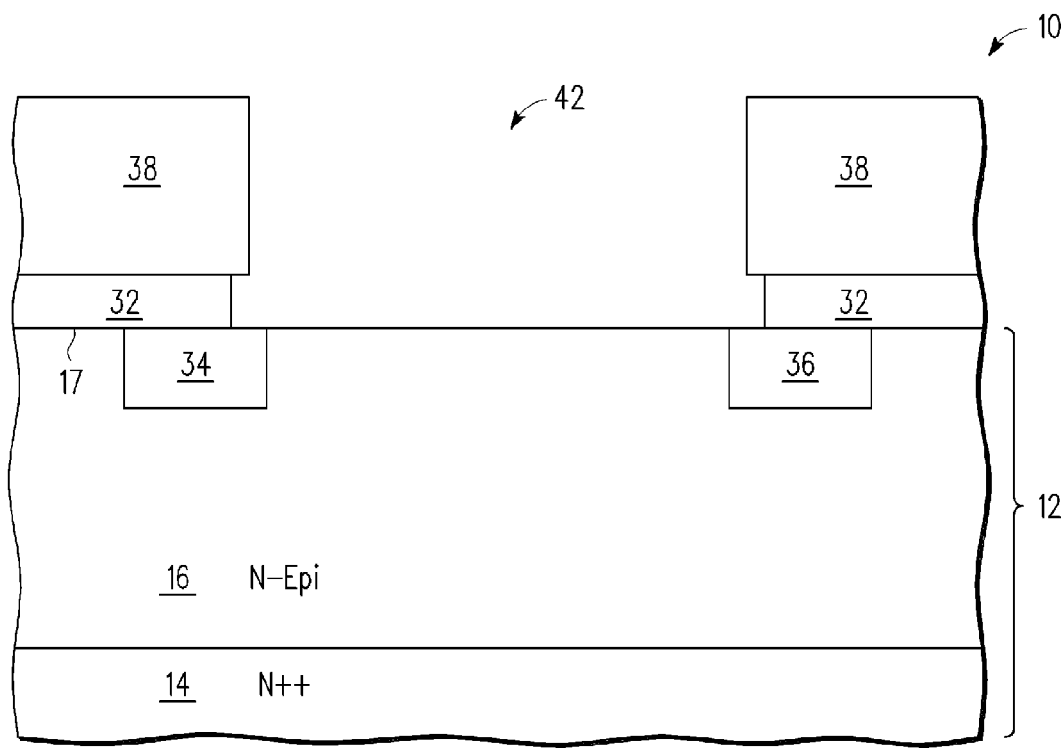

In FIG. 2, mask layer 20 of FIG. 1 is removed and a field oxide layer 32 is grown or otherwise formed to a thickness about twice that of initial oxide 18 as shown in FIG. 2; however, larger or smaller thickness values may also be used. The higher temperatures encountered during deposition or growth of field oxide 32 also causes initial doped regions 28 and 30 to diffuse downwardly and laterally in N-layer 16, thereby providing expanded P-type regions 34 and 36, respectively, as shown in FIG. 3. With reference to FIGS. 3 and 4, mask layer 38 is applied and patterned with an opening 40 to expose a central portion of field oxide layer 32. The central portion of the field oxide layer 32 is conveniently removed by etching through opening 40 in mask layer 38, forming an active area opening 42, as shown in FIG. 5.

Figure 6:
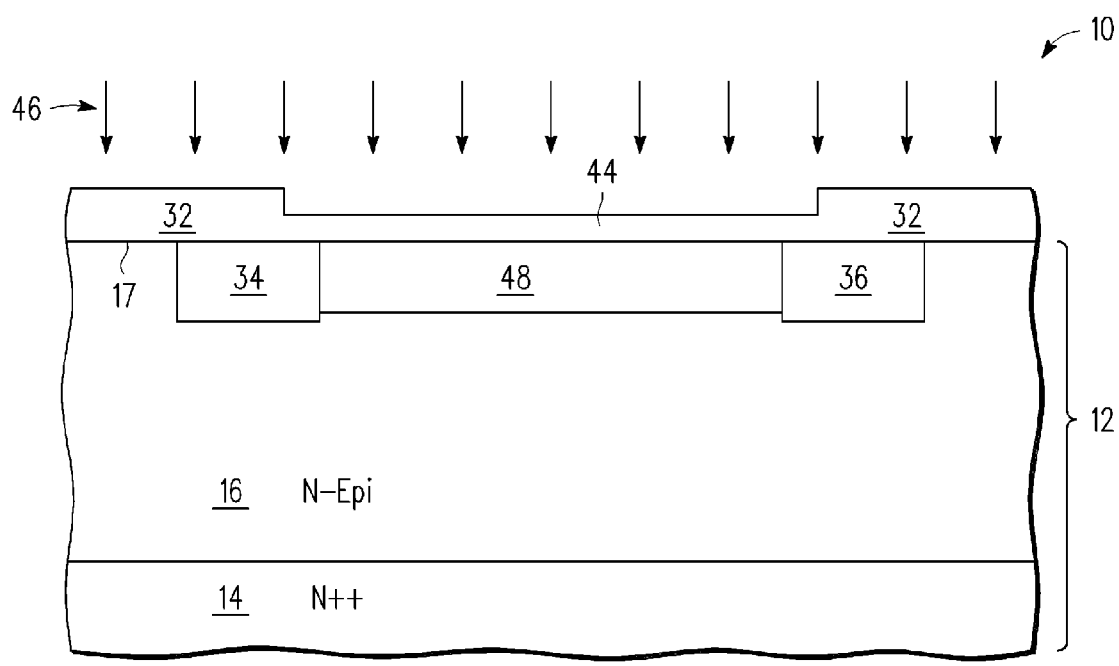

In FIG. 6, a screen oxide 44, typically of a few hundred Angstroms units thickness, is provided on surface 17, e.g., by deposition or thermal growth. A phosphorous implant 46 is then provided. A dose in the range of approximately 5E11 to 9E12/sq cm is useful with about 2E12/sq cm being preferred at an energy in the range of about 100 to 300 keV with about 250 keV being preferred. It is desirable that the phosphorous (or other dopant) atoms of implant 46 form buried doped region 48 below surface 17. Doped buried region 48 will eventually provide the principal doping for JFET region 49 of FIGS. 8-15. In one embodiment, ion implantation 46 comprises the method of providing buried doped region 134; however, it is not essential and other doping and/or deposition techniques well known in the art can also be used to provide buried doped region 48.

Figure 7:
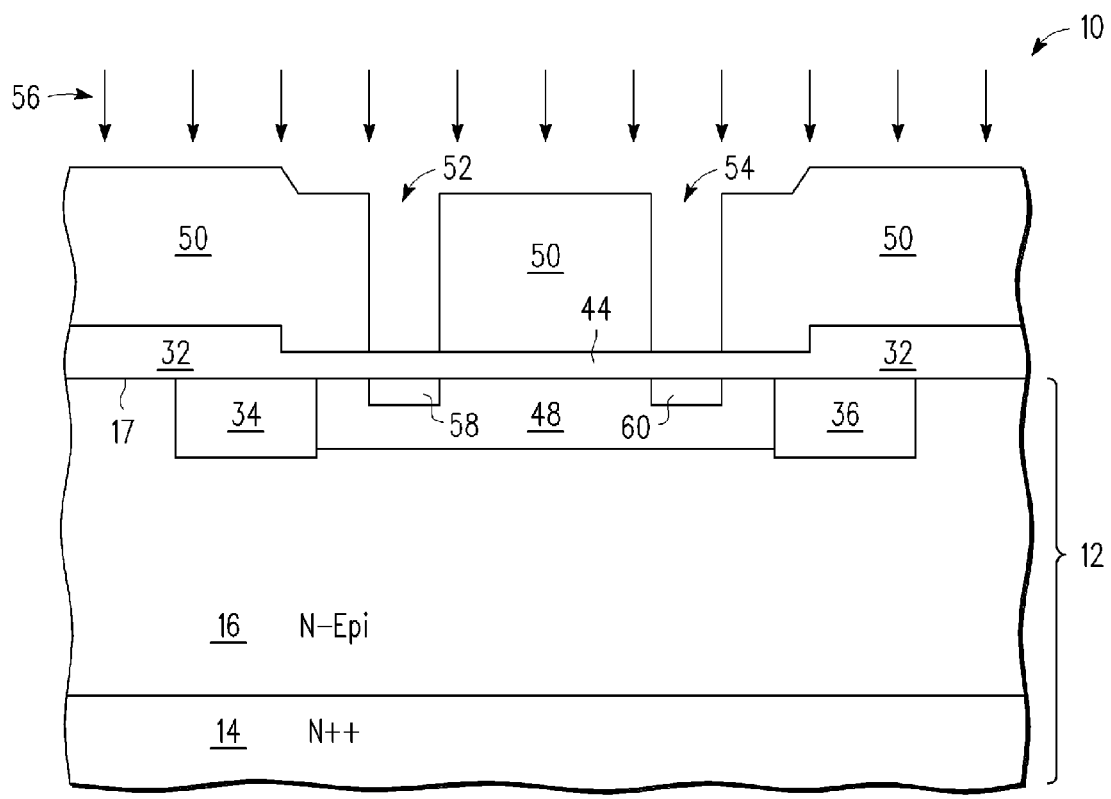

In FIG. 7, mask layer 50 comprises, for example, a suitable photoresist applied on both oxide layer 32 and screen oxide 44 and patterned to provide openings 52 and 54, which extend completely to a top surface of screen oxide 44. P-type implant 56, comprising boron for example, is provided through openings 52 and 54 to a dose of approximately 5E13 at an energy of approximately 70 keV, thereby forming doped regions 58 and 60 beneath openings 52 and 54, respectively. P-type doped regions 58 and 60 are thus introduced into N-type layer 16 through openings 52 and 54, respectively. In one embodiment, ion implantation 56 utilizes boron as a doping method; however, other doping arrangements well known in the art for providing P-type doped regions may also be used.

Figure 8:
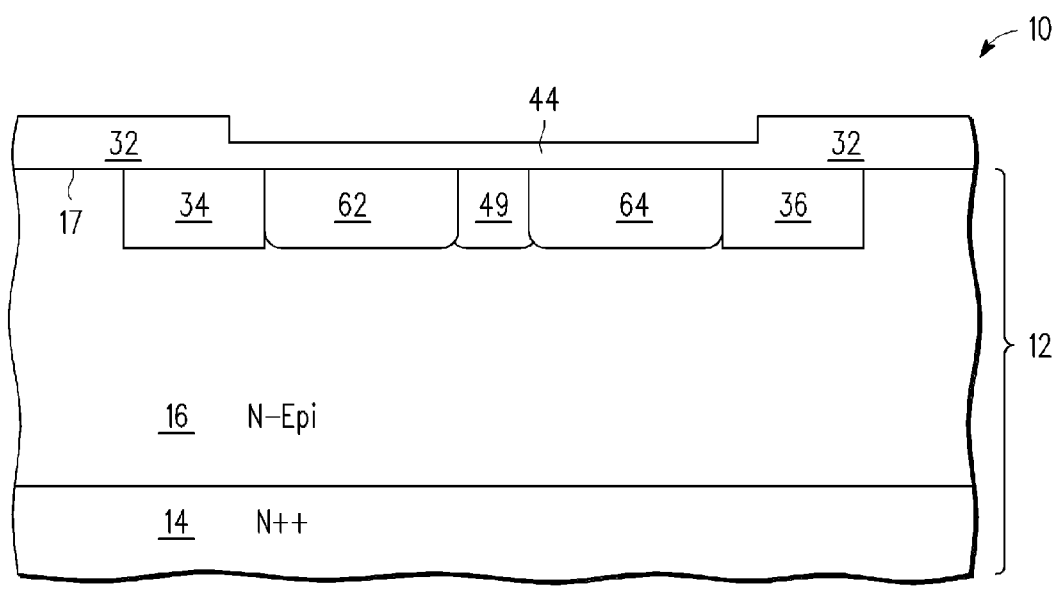

In FIG. 8, a high temperature drive is performed, for example, at a temperature in the range of 900 to 1200 degrees centigrade. In one embodiment, the high temperature drive temperature is approximately 1050 degrees centigrade. The high temperature drive is adapted to redistribute the various dopants so that P-doped doped regions 58 and 60 of FIG. 7 expand to form P-doped regions 62 and 64, respectively, of FIG. 8. In addition the high temperature drive is adapted to redistribute the various dopants so that the N-doped region 48 becomes a central "JFET" region 49. Furthermore, P-doped regions 34 and 36 may also further expand.

Figure 9:
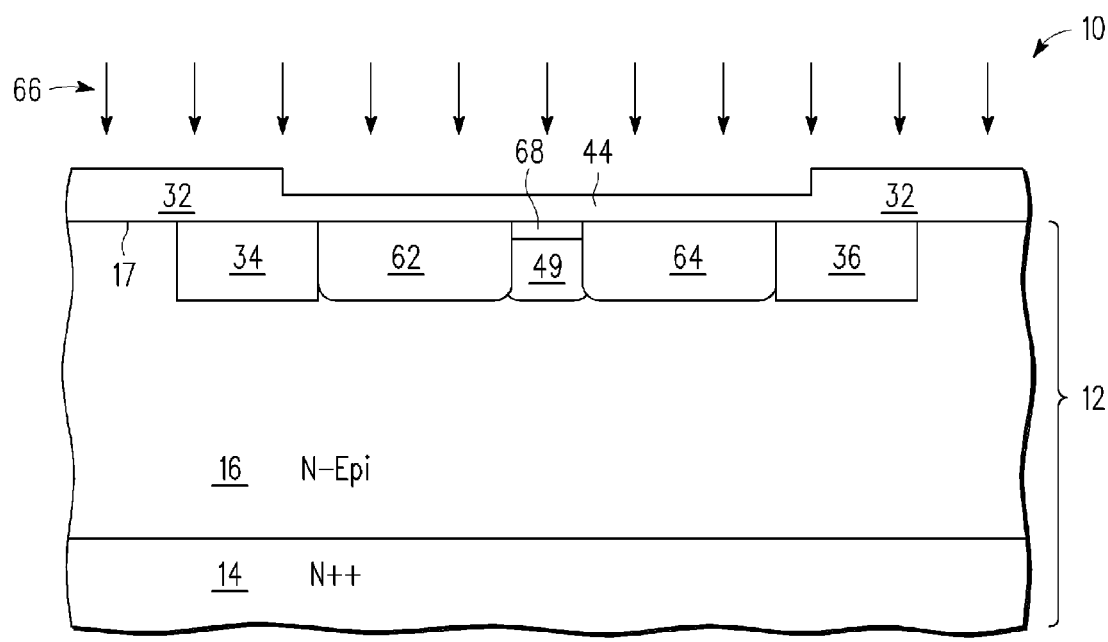
Figure 15:
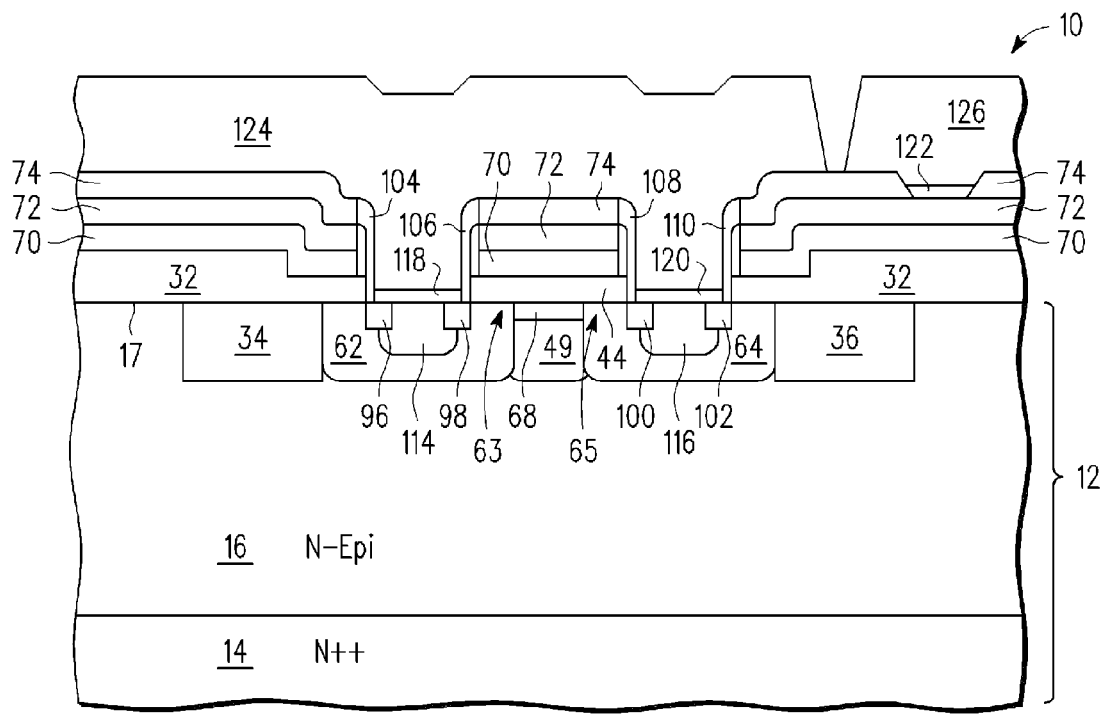
FIG. 15 illustrates a simplified schematic cross-sectional view of a high voltage TMOS device with a low gate charge structure according to one embodiment of the present disclosure.

In FIG. 9, a P-layer implant 66 is performed to create a shallow P-type doped layer or region 68 located approximately just underneath surface 17. Ion implantation 66 comprising, for example, boron provides a desired doping, at about 10-20 KeV, depending upon the thickness of screen oxide layer 130, with about 10 keV being convenient and to a dose in the range of about 1E12 to 1E13 per sq cm with about 5E12 per sq cm being convenient. The P-layer implant 66 advantageously provides a region 68 of opposite type within JFET region 49 near surface 17 so as to achieve between facing channel regions 63 and 65 (as indicated in FIG. 15).

Figure 10:
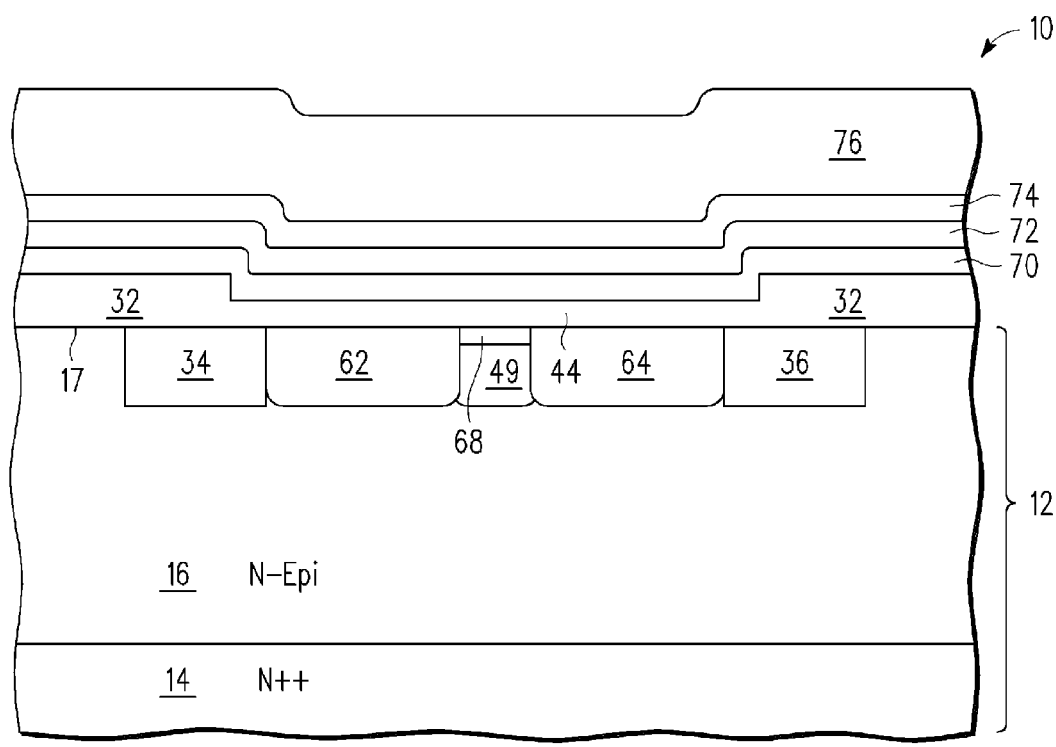

In FIG. 10, screen oxide 44 is preferably removed by a brief etch and a gate oxide formed in its place, typically by thermal growth to a thickness depending upon the desired voltage capabilities and gate capacitance of the resultant TMOS device. Gate oxide thicknesses in the range of 100-500 Angstroms units are convenient with thicknesses in range of 350-

500 Angstrom units being preferred for high voltage power devices; however, larger or smaller thicknesses can also be used. Poly-silicon or other blanket semiconductor (SC) layer 70 is provided over oxide layers 32 and 44. A blanket polycide layer 72, comprising for example tungsten-silicide (WSi$_x$) or other polycide, is subsequently provided over poly-SC layer 70. In addition, a blanket dielectric layer 74, comprising for example silicon dioxide, is subsequently provided over polycide layer 72.

In one embodiment, layers 70, 72, and 74 are conveniently but not essentially formed by chemical vapor deposition (CVD) or plasma enhance chemical vapor deposition (PECVD). Other suitable formation techniques may also be used. Sputtering and evaporation are non-limiting examples of alternative deposition methods for any and all of layers 70, 72, and 74. The thicknesses of layers 70 and 72 should be chosen in conjunction with the choice of materials for these layers so as to provide relatively low resistance gate electrodes. In general, thicknesses of the order of a few thousand Angstrom units are convenient. The thickness of dielectric layer 74 is selected so as to limit capacitive coupling between the source and gate leads to acceptable levels without producing an overly thick device superstructure. Persons of skill in the art will understand how to make such choices.

Figure 11:
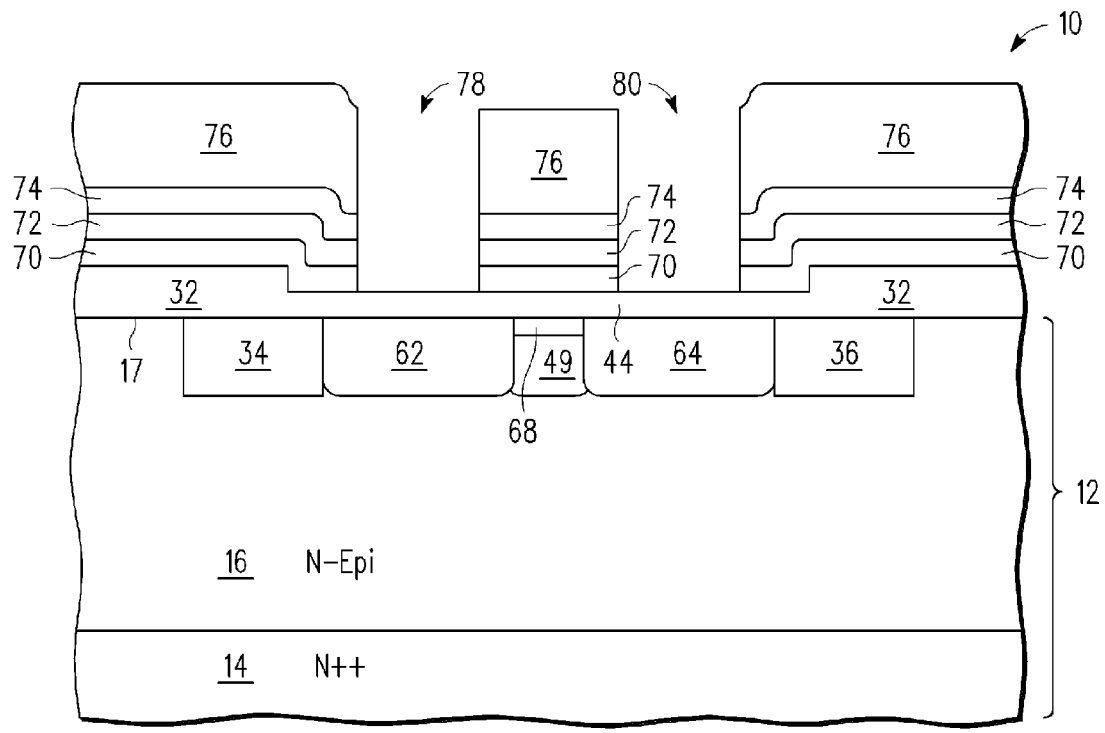

Masking layer 76, comprising for example photoresist, is applied over dielectric layer 74 (FIG. 10) and patterned to provide openings 78 and 80 (FIG. 11) wherein underlying portions of layers 70, 72, and 74 are removed, conveniently by etching, thereby producing the structure shown in FIG. 11.

Figure 12:
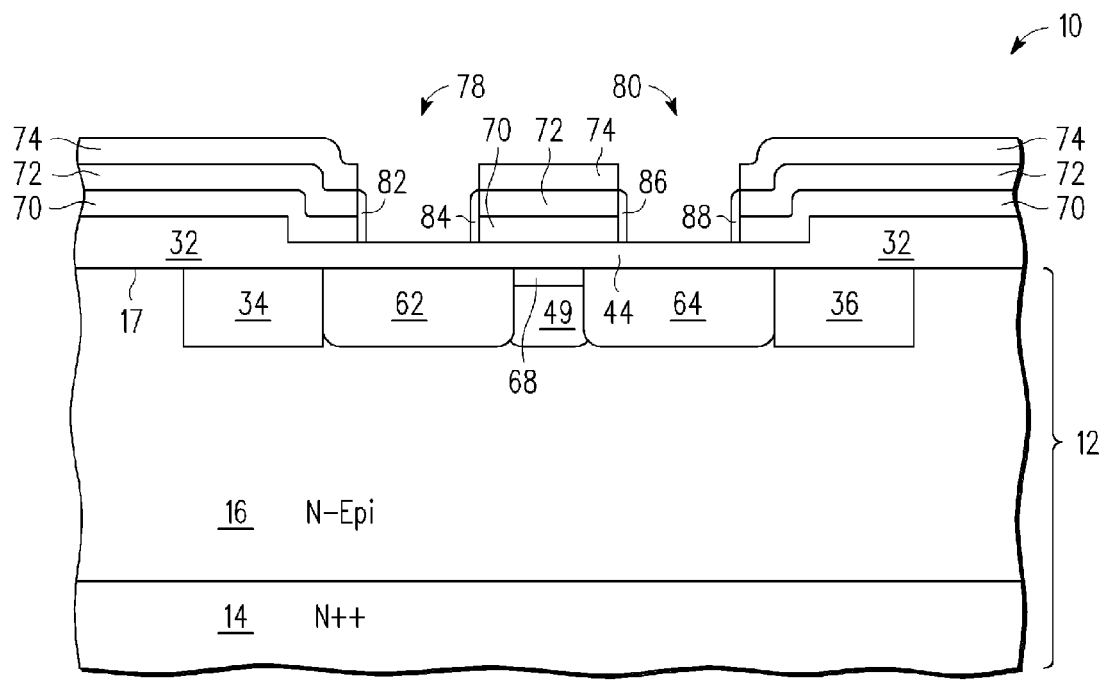

In FIG. 12, masking layer 76 of FIG. 11 is removed and sidewall oxidation is performed to form first side-wall spacers 82, 84, 86, and 88 on the exposed lateral edges of poly-SC layer 70 and polycide layer 72. In the course of this thermal oxidation step to form first sidewall spacers 82, 84, 86, and 88, the P-doped region 68 can expand to become the corresponding P-type layer or region 68, as shown in FIG. 15.

Figure 13:
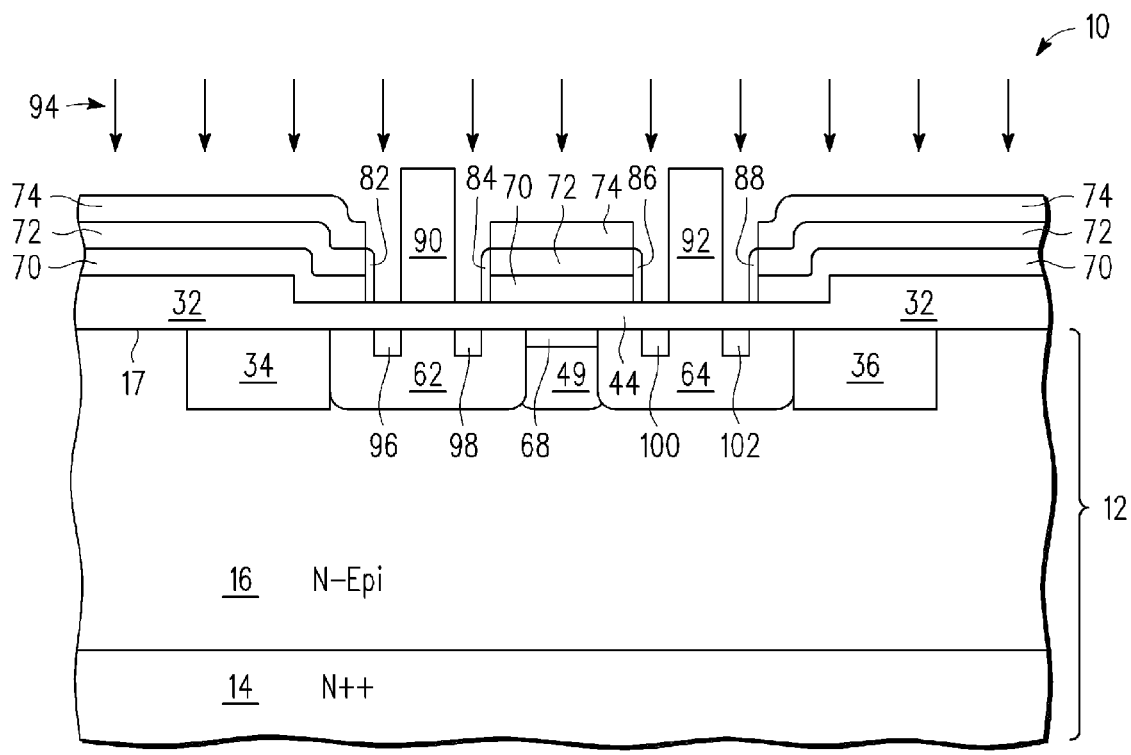

In FIG. 13, mask regions 90 and 92 are provided approximately centrally in openings 78 and 80, thereby leaving openings between mask region 90 and side-wall spacers 82 and 84 and between mask region 92 and side-wall spacers 86 and 88. Then, N+ implant 94, comprising for example arsenic at an energy of about 50-100 keV to a dose of about 1E15 to 10E15 per sq cm, preferably at about 80 keV to a dose of about 4E15 per sq cm, is applied conveniently through oxide layer 44 to form source regions 96, 98, 100, and 102, as shown in FIG. 13. While ion implantation is preferred, other doping means well known in the art may also be used.

Figure 14:
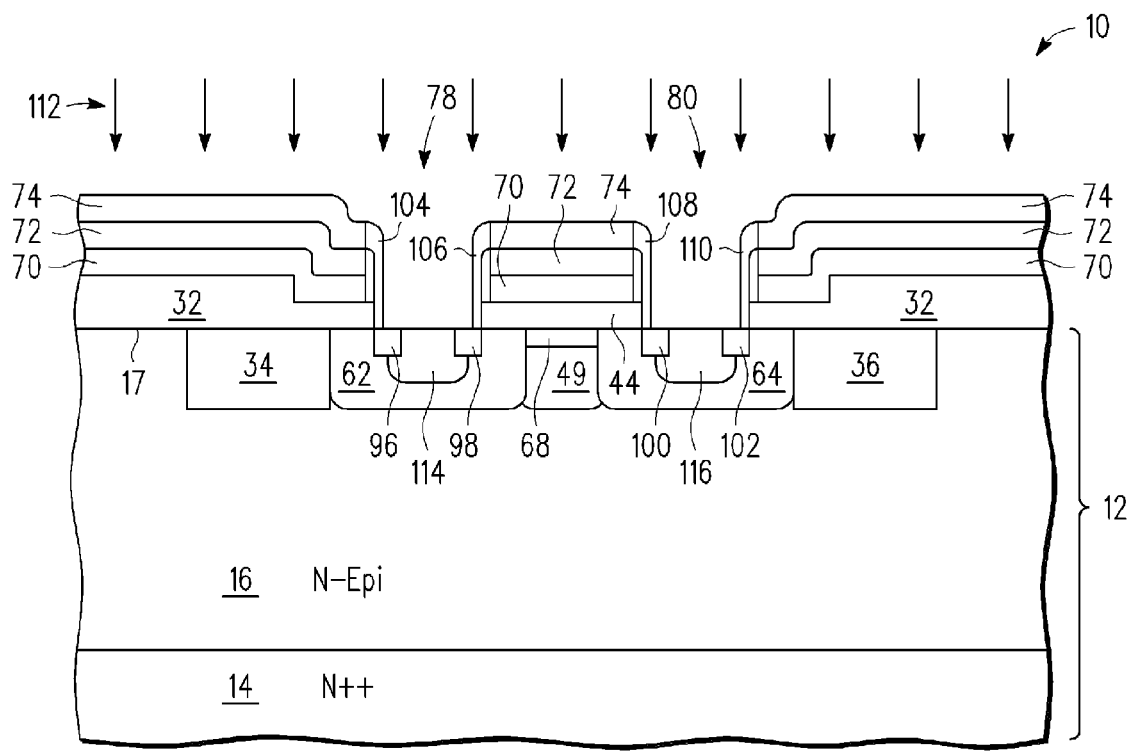

In FIG. 14, mask regions 90 and 92 of FIG. 13 are removed and a blanket layer of dielectric, such as for example, silicon oxide, is deposited over the structure of FIG. 13 (e.g., by CVD, PECVD, evaporation or sputtering) and then differentially etched using means well known in the art to provide second side-wall spacers 104, 106, 108, and 110 on the lateral edges of layers 70, 72, 74 in openings 78 and 80. The anisotropic etch also removes oxide layer 44 exposed by openings 78 and 80. Then, P-type implant 112 is provided into surface 17 through openings 78 and 80 to form P-type regions 114 and 116. Any type of convenient P-type implant material can be used, for example, boron implanted at energies in the range of about 10-80 keV to a dose of about 0.5E15 to 3E15 per sq cm is convenient, with an energy of about 40 keV and a dose of about 1E15 per sq cm being preferred, thereby providing the structure illustrated in FIG. 14.

In FIG. 15, an opening is etched through dielectric layer 74 to permit contact to polycide layer 72. Then an inter-metallic conductive barrier layer is deposited, masked and etched to leave regions 118 and 120 in contact with source regions 114, 116 and body contact regions 96, 98, 100, 102, and region 122 in contact with polycide layer 72. The inter-metallic conductive barrier layer comprises, for example, Ti or TiN, or other suitable inter-metallic conductive barrier material.

Then a layer of Al, Cu, Al/Cu alloy or other highly conductive material is deposited over the structure and masked and etched to provide source/body lead 124 in contact with conductive barrier layer regions 118,120 and gate lead 126 in contact with conductive barrier layer region 122, as shown in FIG. 15. The structure illustrated in FIG. 15 is then substantially complete.

Figure 16:
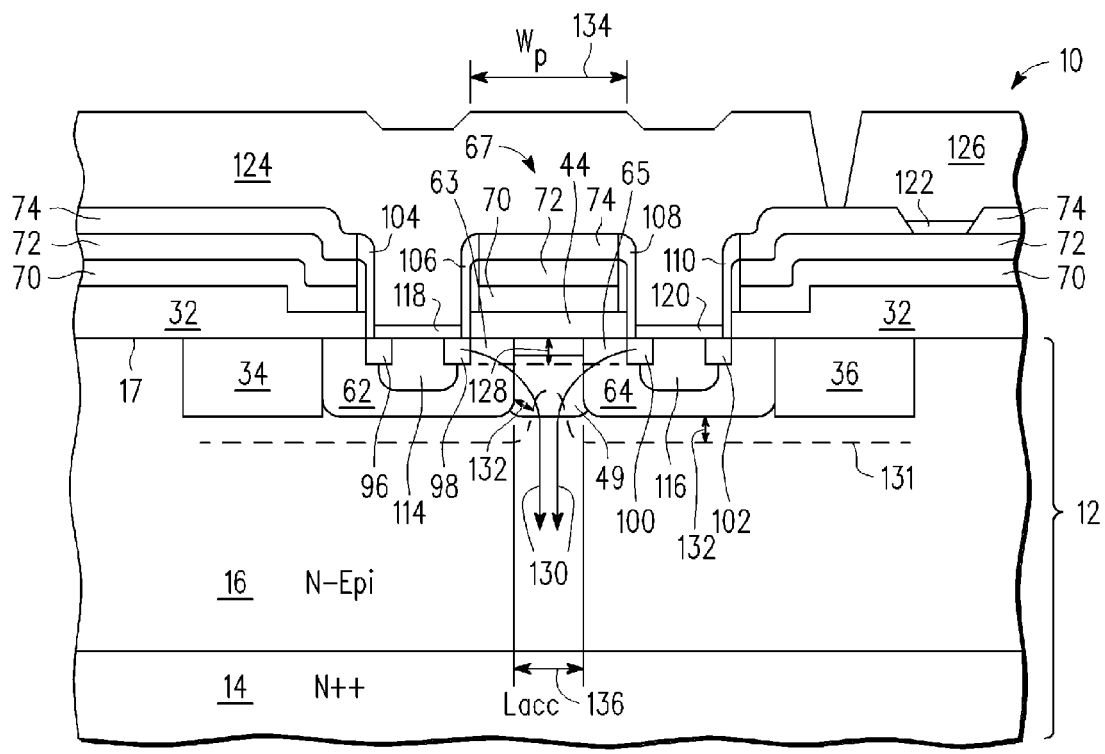
FIG. 16 illustrates a simplified schematic cross-sectional view of the high voltage TMOS device of FIG. 15, further illustrating a depletion region junction profile according to one embodiment of the present disclosure.

FIG. 16 is similar to FIG. 15, with the exception that FIG. 16 contains additional designations as indicated in the following. N++ drain region 14 is provided at or adjacent a lower surface of wafer 12. N-Epi region 16 extends upwardly from N++ drain region 12. P-body regions 62 and 64 extend into N-Epi region 16 from surface 17 and are laterally separated by distance Lacc, as indicated by reference numeral 136. P++ body contact regions 114, 116 and N++ source regions 96,98, 100,102 extend into corresponding P-body regions 62,64. Gate dielectric (e.g., of silicon dioxide) 44 overlies surface 17 above channel regions 63,65 and so-called JFET region 49, and may extend partly above source regions 98,100. Conductive gate electrode 67 of width W$_P$, indicated by reference numeral 134, overlies gate dielectric 44.

Gate electrode 67 is desirably a composite gate stack wherein layer 70 is conveniently of doped poly-silicon and layer 72 is conveniently of a polycide such as for example, tungsten-silicide, that is, WSi$_x$, but other composition ranges and other polycides can also be used. The combination of poly-Si layer 70 and polycide layer 72 advantageously provides low gate resistance, which assists in obtaining good high frequency properties. An external contact (not shown) is remotely provided to conductor 72 of gate electrode 67.

Dielectric layer 74 (e.g., of silicon oxide) is provided over gate electrode 67 so that source lead 124 may bridge over gate electrode 67 above active channel regions 63,65 and JFET region 49, making contact to source regions 96,98,100,102 on either side of gate electrode 67. Conductive barrier material 118,120 of, for example, TiN or other conductive intermetallic, may be provided between source and body contact regions 96,114,98,100,116,102 and source/body lead 124 to retard inter-diffusion of polycide 72 and the material of lead 124 and thereby advantageously maintain low resistance contacts to source/body contact regions 96,114,98,100,116,102. Other conductive contact materials may also be used for source/body lead 124 or lead 124 may be applied directly to source/body contact regions 96,114,98,100,116,102, although this is less desirable.

Side-wall spacers 82,104,84,106,86,108,88,110 are provided to separate the lateral edges of gate electrode 67 from source and body contacts 118,120 and source lead 124. Opposite type region 68 is located between facing channel regions 63,65. This is a significant improvement over prior art TMOS devices. The channel lengths L$_{CH}$ of channel regions 63,65 are equal to (½)*(W$_P$–Lacc). Reference numeral 128 indicates the channel region width at device forward working (i.e., for Vgs>Vt). When appropriately biased, current flows from sources 98,100 to drain 14 as indicated by arrows 130. In addition, reference numeral 132 indicates the depletion region width at device reverse working (i.e., for Vgs=0, Vds=BVdss). Furthermore, reference numeral 131 indicates a high voltage breakdown profile for the TMOS device 10.

In one embodiment, doping concentration as a function of depth from a principal surface 17 for TMOS device 10 of FIG. 16 at a central location under gate electrode 67 located halfway between P-body regions 62,64 under gate electrode 67 can comprise the following. The concentration of P-type dopant (e.g., boron) extends to a given depth beneath gate electrode 67, which P-type dopant originates via a P-type implant into JFET region 49 near surface 17 so as to achieve a region 68 between the facing channel regions 63,65. Region 68 is important for obtaining the improved performance of the structures according to the embodiments of the present disclosure. The concentration of N-type dopant (e.g., phosphorous) extends to a given depth into substrate 12 from principal surface 17, below region 68, to achieve the corresponding JFET region 49 and N-Epi 16. As previously discussed herein, the N-type dopant originates from an N-type implant into JFET region 49 to enhance the doping therein. Furthermore, the N-Epi region 16 extends to a depth that terminates at an upper boundary of highly doped N++ drain region 14.

By now it should be appreciated that there has been provided a TMOS device 10 that comprises: a semiconductor layer 16 of a first conductivity type having a top surface 17; a gate stack 67 comprising a gate dielectric 44 and a gate conductor 70,72 over the semiconductor layer; a first doped region 62 extending from the top surface of the semiconductor layer into the semiconductor layer to a first depth under a first portion of the gate stack 67, wherein the first doped region is of the second conductivity type; a second doped region 64 extending from the top surface 17 of the semiconductor layer into the semiconductor layer to the first depth under a second portion of the gate stack 67, wherein the second doped region is of the second conductivity type; a third doped region 68 extending from the top surface of the semiconductor layer into the semiconductor layer to a second depth and located between the first and second doped regions 62,64 and directly connected to the first and second doped regions, wherein the third doped region is of the second conductivity type and the first depth is greater than the second depth; a fourth doped region 98 extending from the top surface 17 of the semiconductor layer into the semiconductor layer directly connected to the first doped region, wherein the fourth doped region 98 is of the first conductivity type; and a fifth doped 100 region extending from the top surface of the semiconductor layer into the semiconductor layer directly connected to the second doped region, wherein the fifth doped region 100 is of the first conductivity type. In one embodiment, the first conductivity type is n-type and the second conductivity type is p-type.

In one embodiment, the third doped region 68 of the TMOS device is doped with dopants of the first conductivity type and the second conductivity type, wherein a concentration of the dopants of the second conductivity exceeds a concentration of the dopants of the first conductivity. In addition, the concentration of the dopants of the second conductivity exceeds the concentration of the dopants of the first concentration by less than about fifteen (15) percent. Furthermore, a difference between the concentration of the dopants of the second conductivity and the concentration of the dopants of the first concentration establishes a degree of doping, wherein the third doped region 68 is less heavily doped than the first and second doped regions 62,64. In yet another embodiment, the TMOS device 10 further comprises a sixth doped region 49 of the first conductivity type in the semiconductor layer and under the third doped region 68 having the first conductivity type and doped more heavily than the semiconductor layer 16.

In another embodiment, a method of forming a TMOS device 10 in and over a semiconductor layer 16 of a first conductivity type, comprises: forming a first doped region 62 and a second doped region 64 in the semiconductor layer, wherein the first doped region and the second doped region are spaced apart and are of a second conductivity type; implanting to form a third doped region 68 in the semiconductor layer 16 between the first and second doped regions, wherein the third doped region directly contacts the first and second regions, is of the second conductivity type, and is less heavily doped than the first and second doped regions; forming a gate stack 67 over a portion of the first doped region, a portion of the second doped region, and the third doped region; and implanting to form a fourth doped region 98 in an interior portion of the first doped region and a fifth doped region 100 in an interior portion of the second doped region after forming the gate stack, wherein the fourth and fifth doped regions are of the first conductivity type.

In a further embodiment, the step of implanting to form the third doped region 68 is further characterized as shallow implanting so that the depth of the third doped region is less than a depth of the first and second doped regions 62,64. The step of implanting to form the third doped region is further characterized as implanting boron. The step of forming the third doped region 68 is further characterized as implanting the boron to establish a concentration in excess of a concentration of dopants of the first conductivity at a surface 17 of the semiconductor layer 16. The step of forming the third doped region 68 is further characterized as implanting the boron to establish an excess concentration over the concentration of dopants of the first conductivity at a surface 17 of the semiconductor layer 16 of not more than about fifteen (15) percent.

In yet another embodiment, the method further comprises implanting dopants of the first conductivity into the semiconductor layer 16 extending from a top surface 17 of the semiconductor layer to a depth of less than half a thickness of the semiconductor layer prior to the step of implanting to form the third doped region 68. The step of forming the first and second regions 62,64 comprises: forming a mask 50 having a first opening 52 and a second opening 54 over the semiconductor layer 16; implanting through the first and second openings; and performing a heating step. The method further comprises implanting with boron into the first region 62 in an area adjacent to the fourth region 98 to form a first contact region and into the second region 64 in an area adjacent to the fifth region 100 to form a second contact region. The method still further comprises forming a first metallic layer 118 over the first contact region and the fourth doped region and a second metallic layer 120 over the second contact region and the fifth doped region.

In still another embodiment, a method of forming a TMOS device in and over a semiconductor layer 12 having a portion 14 that functions as a drain of the TMOS device, comprises: forming a first channel region 63 and a second channel region 65 in the semiconductor layer 16; forming a third channel region 68 in the semiconductor layer between the first and second channel regions having a doping concentration lower than that of the first and second channel regions, wherein the third channel region is over the portion 14 of the semiconductor layer that functions as a drain; forming a gate stack 67 over the third channel region 68; and forming a first source region 98 in the semiconductor layer adjacent to the first channel region 63 and a second source region 100 in the semiconductor layer adjacent to the second channel region 65. The step of forming the third channel region 68 can comprise implanting boron between the first and second channel regions. In addition, the step of implanting boron is further characterized as implanting shallow implanting boron so that the third channel region 68 is shallower than the first and second channel regions 63,65. Furthermore, the step of forming the third channel region 68 is further characterized as counterdoping a portion of the semiconductor layer used as the third channel region having a background doping to exceed the background doping by no more than fifteen (15) percent. Still further, the step of forming the third channel region 68 can comprise blanket doping the semiconductor layer after the first and second channel regions have been formed.

Although the invention has been described with respect to specific conductivity types or polarity of potentials, skilled artisans appreciated that conductivity types and polarities of potentials may be reversed.

In addition, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can be implemented in power management applications, fast switching DC-DC converter applications, or other applications. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of forming a TMOS device in and over a semiconductor layer of a first conductivity type, comprising:
    forming a first doped region and a second doped region in the semiconductor layer, wherein the first doped region and the second doped region are spaced apart and are of a second conductivity type;
    implanting to form a third doped region in the semiconductor layer between the first and second doped regions, wherein the third doped region directly contacts the first and second regions, is of the second conductivity type, and is less heavily doped than the first and second doped regions;
    forming a gate stack over a portion of the first doped region, a portion of the second doped region, and the third doped region; and
    implanting to form a fourth doped region in an interior portion of the first doped region and a fifth doped region in an interior portion of the second doped region after forming the gate stack, wherein the fourth and fifth doped regions are of the first conductivity type.

2. The method of claim 1, wherein the step of implanting to form the third doped region is further characterized as shallow implanting so that the depth of the third doped region is less than a depth of the first and second doped regions.

3. The method of claim 2, wherein the step of implanting to form the third doped region is further characterized as implanting boron.

4. The method of claim 3, wherein the step of forming the third doped region is further characterized as implanting the boron to establish a concentration in excess of a concentration of dopants of the first conductivity at a surface of the semiconductor layer.

5. The method of claim 3, wherein the step of forming the third doped region is further characterized as implanting the boron to establish an excess concentration over the concentration of dopants of the first conductivity at a surface of the semiconductor layer of not more than about 15 percent.

6. The method of claim 1, further comprising implanting dopants of the first conductivity into the semiconductor layer extending from a top surface of the semiconductor layer to a depth of less than half a thickness of the semiconductor layer prior to the step of implanting to form the third doped region.

7. The method of claim 6 wherein the step of forming the first and second regions comprises:
    forming a mask having a first opening and a second opening over the semiconductor layer;
    implanting through the first and second openings; and
    performing a heating step.

8. The method of claim 7, further comprising implanting with boron into the first region in an area adjacent to the fourth region to form a first contact region and into the second region in an area adjacent to the fifth region to form a second contact region.

9. The method of claim 8, further comprising forming a first metallic layer over the first contact region and the fourth doped region and a second metallic layer over the second contact region and the fifth doped region.

10. A method of forming a TMOS device in and over a semiconductor layer having a portion that functions as a drain of the TMOS device, comprising:
    forming a first channel region and a second channel region in the semiconductor layer;
    forming a third channel region in the semiconductor layer between the first and second channel regions having a doping concentration lower than that of the first and second channel regions, wherein the third channel region is over the portion of the semiconductor layer that functions as a drain;
    forming a gate stack over the third channel region; and
    forming a first source region in the semiconductor layer adjacent to the first channel region and a second source region in the semiconductor layer adjacent to the second channel region.

11. The method of claim 10, wherein the step of forming the third channel region comprises implanting boron between the first and second channel regions.

12. The method of claim 11, wherein the step of implanting boron is further characterized as implanting shallow implanting boron so that the third channel region is shallower than the first and second channel regions.

13. The method of claim 10, wherein the step of forming the third channel region is further characterized as counter-doping a portion of the semiconductor layer used as the third channel region having a background doping to exceed the background doping by no more than 15 percent.

14. The method of claim 10 wherein the step of forming the third channel region comprises blanket doping the semiconductor layer after the first and second channel regions have been formed.

* * * * *